(12) United States Patent
Abert et al.

(10) Patent No.: US 9,195,284 B2
(45) Date of Patent: Nov. 24, 2015

(54) AUTOMATION DEVICE

(75) Inventors: Michael Abert, Au (DE); Michael Cyron, Karlsruhe (DE); Arnold Klamm, Kandel (DE); Valentin Kort, Landau (DE)

(73) Assignee: Siemens Aktiengesellschaft, Munich (DE)

( * ) Notice: Subject to any disclaimer, the term of this patent is extended or adjusted under 35 U.S.C. 154(b) by 780 days.

(21) Appl. No.: 13/353,024

(22) Filed: Jan. 18, 2012

(65) Prior Publication Data

US 2012/0181866 A1 Jul. 19, 2012

(30) Foreign Application Priority Data

Jan. 19, 2011 (EP) .................................. EP11151448

(51) Int. Cl.
*H02J 4/00* (2006.01)
*G06F 1/20* (2006.01)
*H05K 7/14* (2006.01)
*H05K 7/20* (2006.01)

(52) U.S. Cl.
CPC .............. *G06F 1/206* (2013.01); *H05K 7/1465* (2013.01); *H05K 7/20127* (2013.01); *Y02B 60/1275* (2013.01); *Y10T 307/406* (2015.04)

(58) Field of Classification Search
CPC .. G01R 19/2513; G01R 22/00; G01R 21/133; H02H 1/0061; H02J 13/00; H02J 3/00; G06F 17/40; Y10S 707/99931
USPC ................................................ 307/1, 3, 4, 31
See application file for complete search history.

(56) References Cited

U.S. PATENT DOCUMENTS

| 5,828,576 A * | 10/1998 | Loucks et al. ................... 702/65 |
| 2002/0195953 A1 | 12/2002 | Belliveau |
| 2003/0122683 A1* | 7/2003 | Downer ..................... 340/686.1 |
| 2007/0290833 A1* | 12/2007 | Cartwright et al. ........... 340/538 |
| 2010/0004792 A1* | 1/2010 | Lopez et al. ................. 700/292 |
| 2010/0026309 A1 | 2/2010 | Abert et al. |

FOREIGN PATENT DOCUMENTS

| EP | 2 073 618 | 6/2009 |
| EP | 2 149 956 | 2/2010 |

* cited by examiner

*Primary Examiner* — Thienvu Tran
*Assistant Examiner* — David M Stables
(74) *Attorney, Agent, or Firm* — Cozen O'Connor

(57) ABSTRACT

An automation device having a plurality of modules, where at least one first module is configured to supply the other modules electrical power and a second module is configured to determine the total power requirement of the automation device, wherein the second module determines the total power requirement from the information relating to the power requirement of the respective module, which information is stored in the other modules, and compares the total power requirement with a threshold value and initiates measures for reducing the power requirement of at least one of the other modules based on the comparison result to prevent an overload due to improper or inappropriate installation of the automation device in a switchgear cabinet and resultant reduced air convection.

7 Claims, 1 Drawing Sheet

-- Prior Art --

AUTOMATION DEVICE

BACKGROUND OF THE INVENTION

1. Field of the Invention

The invention relates to devices for preventing overloads and, more particularly, to an automation device having a plurality of modules, where at least one first module is configured to supply the other modules with electrical power and a second module is configured to determine the total power requirement of the automation device, and where the second module determines the total power requirement from the information relating to the power requirement of a respective module, which information is stored in the other modules, compares the power requirement with a threshold value and initiates measures for reducing the power requirement of at least one of the other modules based on the comparison result.

2. Description of the Related Art

Siemens catalog ST PCS 7, chapter 6, February 2010 edition, discloses an automation device having a plurality of modules implemented as subassemblies arranged on a carrier, which each have a printed circuit board provided with electrical and electronic components inside a housing capsule. These components are cooled substantially by convection such that air flows through an opening on the underside of the housing capsule, flows across the components and finally flows through an opening on the top side of the housing capsule, where the air flowing through the housing removes heat from the components. On account of subassemblies designed in this manner, sufficient cooling is possible only when the carrier is arranged horizontally and the subassemblies are arranged vertically on the carrier.

EP 2 073 618 A1 discloses an arrangement in which the heat respectively produced in the subassemblies is supplied to a part on the rear side of a carrier, which part is angled through 90°, via thermally conductive contact-making means to improve the convection in an automation device. This angled part, which extends over the entire length of the carrier, is provided as a heat sink on which air ducts that are provided with a square cross section and comprise a material that does not store heat are arranged, thus achieving a substantially laminar air flow in the air ducts, avoiding turbulence in the air ducts and achieving a very high air throughput in the air ducts and very good heat dissipation. Even with an automation device designed in this manner, sufficient cooling is possible only when the carrier is arranged horizontally in a switchgear cabinet, for example.

A user generally decides, when planning such automation devices, which power supply subassembly is suitable for the subassemblies needed to solve an automation problem so that these subassemblies, for example, subassemblies comprising CPU subassemblies, communication subassemblies, input/output subassemblies or other subassemblies suitable for the automation device, can be sufficiently supplied with the corresponding electrical power even at full load. Here, planning software uses subassembly-specific information to check whether the required expansion of the automation device is permissible at all with regard to the number of subassemblies required and the power requirement thereof, with regard to the respective power loss of the subassemblies to be vertically installed and with regard to a maximum permissible ambient temperature at the place of use. If the expansion is permissible, the planning operation with respect to power balancing is concluded.

When starting up the planned automation device or when changing the planned hardware configuration, the CPU subassembly initially checks, before the actual control mode for solving the automation problem, whether the maximum electrical power which can be provided by the planned power supply subassembly at full load also actually suffices to sufficiently supply the subassemblies. For this purpose, the CPU subassembly reads the information relating to the respective power requirement or the respective power consumption of the subassemblies, which information is stored in the subassemblies, and uses this information to calculate the total power requirement of the automation device. In addition, the CPU subassembly reads the information relating to the maximum current output or the maximum power that can be provided by the power supply subassembly, which information is stored in the power supply subassembly, and compares this power with the total power requirement of the automation device. If the total power requirement exceeds the maximum power, the CPU subassembly prevents the automation device from "running up" and adopting the control mode ("RUN" operating state) or deactivates at least one subassembly that thus does not participate in the control mode. If the automation device has a plurality of power supply subassemblies, the CPU subassembly naturally determines the maximum possible total power output from the information relating to the maximum power output of the respective power supply subassembly, where the information is stored in each power supply subassembly.

As already mentioned, however, fault-free operation of the planned automation device at full load is ensured only when sufficient heat dissipation is ensured. As a result, on account of the structural design of conventional automation devices, the carrier must be mounted horizontally and the subassemblies must be mounted vertically in a switchgear cabinet, or positioned or arranged at another suitable erection site. If a user arranges the subassemblies horizontally in a switchgear cabinet, sufficient heat dissipation is no longer ensured. Consequently, the subassemblies may overheat at full load and may fail.

EP 2 149 956 A1 discloses another conventional automation device. Here, the power supply modules comprising source modules and other modules comprising sink modules are provided with identification means that represent the respective power capacity or power output of the source modules and represent the respective power requirement of the sink modules. On account of these identification means, power balancing is possible both in modules or subassemblies that output current and in modules or subassemblies that draw current. Measures for preventing an overload on account of improper or inappropriate installation in a switchgear cabinet, for example, and resultant reduced air convection are not provided.

SUMMARY OF THE INVENTION

It is therefore an object of the invention to provide an automation device that avoids the disadvantages of conventional automation device.

This and other objects and advantages are achieved in accordance with the invention by providing an automation device with a position sensor that detects the position of the automation device at an installation or erection site of the automation device, where the second module predefines or determines the threshold value based on the position of the automation device.

The invention is based on the notion of being able to effect "position-dependent" power balancing. Irrespective of the installation position of the automation device, for example, irrespective of whether the automation device is installed or erected horizontally or vertically, it is ensured that, for example, operation of the automation device or at least one of the modules of the automation device is prevented if a threshold value or a permissible power output is reached or exceeded.

For example, if the carrier of the automation device is installed horizontally in a switchgear cabinet and conventional subassemblies are mounted vertically on the carrier, the threshold value can be selected according to the maximum power that can be provided by the power supply subassembly at full load. This is because good air convection and heat dissipation are ensured in this installation position on account of the configuration of the subassemblies. As a result, it can be assumed that overheating is avoided even during full-load operation of the subassemblies.

If, in contrast, the carrier is installed vertically, i.e., the subassemblies are arranged horizontally, good air convection and heat dissipation are no longer provided in this installation position. Here, it must therefore be assumed that the subassemblies will overheat during full-load operation if the threshold value is selected according to the maximum power that can be provided by the power supply subassembly at full load. In order to avoid this overheating, the threshold value is selected to be lower in this installation position. For example, the CPU subassembly sets the threshold value or the permissible power output in a manner corresponding to 0.6 times the maximum power that can be provided by the power supply subassembly at full load. If the CPU unit determines a total power requirement of the subassemblies that is above this threshold value, the CPU unit initiates measures for reducing the power requirement for at least one of the subassemblies of the automation device. The threshold value is selected such that fault-free operation of the automation device is ensured despite reduced heat dissipation and the subassemblies do not overheat. If the power requirement of the remaining subassemblies is still above this threshold value, the CPU unit in turn deactivates one of the other subassemblies, where the situation may occur in which the automation device does not adopt the control mode because the CPU subassembly switches the automation device to a "STOP" operating state.

In an embodiment of the invention, the reaching or exceeding of the threshold value is indicated. As a result, a user can initiate suitable measures to prevent an overload on account of the installation position.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, its refinements and advantages are explained in more detail below using the drawing which illustrates one exemplary embodiment of the invention, and in which.

DETAILED DESCRIPTION OF THE PRESENTLY EMBODIMENTS

Figure 1:
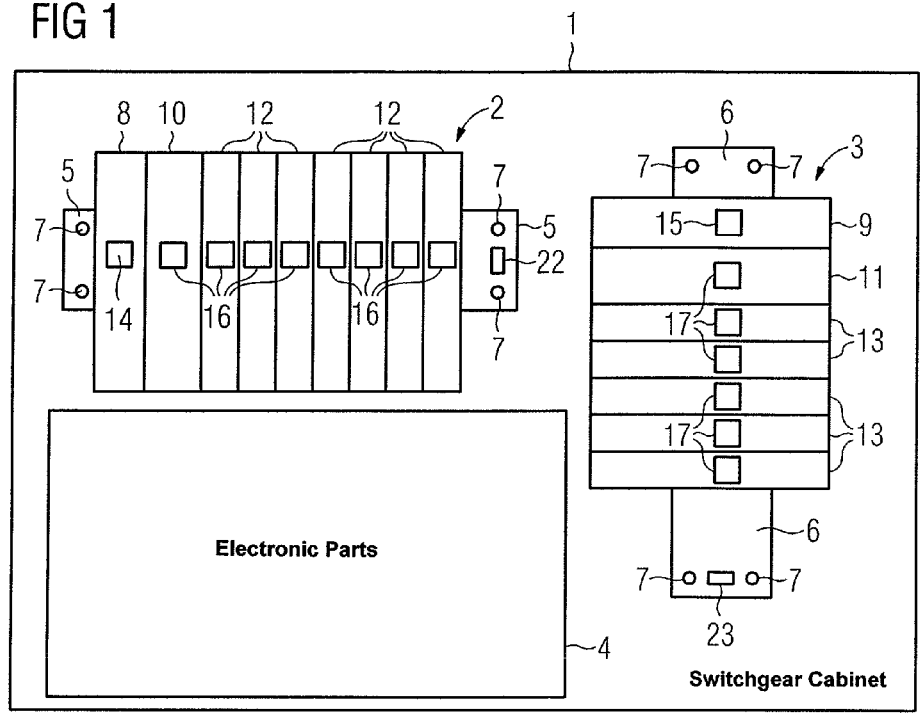
FIG. 1 is a simplified illustration of a switchgear cabinet fitted with automation devices.

In FIG. 1, reference numeral 1 is used to denote a switchgear cabinet in which a first automation device 2 and a second automation device 3 and other electrical and electronic parts 4 are mounted. The automation devices 2, 3 have a plurality of modules which, in the present exemplary embodiment, comprise subassemblies that are swung open beside one another on carriers 5, 6, such as top-hat rails. After the subassemblies are swung open, they are secured to these carriers 5, 6 by screw connections (not illustrated for purposes of clarity). The carriers 5, 6 each have four holes 7 into which screw connections (likewise not illustrated for purposes of clarity) for fastening or mounting the carriers 5, 6 in the switchgear cabinet 1 are inserted. Each of the automation devices 2, 3 has a power supply subassembly 8, 9, a CPU subassembly 10, 11 and other peripheral, functional and communication subassemblies 12, 13 that are required for operation of the automation devices 2, 3, where the subassemblies interchange information over a bus or over other suitable connections. It should be understood that both automation devices 2, 3 may likewise be connected to one another by communication lines or the two carriers 5, 6 may be provided only with subassemblies of one automation device, where each of the carriers 5, 6 have, in the latter case, a connection subassembly that are coupled to one another by suitable communication connections.

Each of the power supply subassemblies 8, 9 includes a memory 14, 15 that respectively stores the maximum current or power output of the respective power supply subassemblies 8, 9. The other subassemblies of the automation devices 2, 3, i.e., the CPU subassemblies 10, 11 and the peripheral, functional and communication subassemblies 12, 13, are likewise provided with a memory 16, 17 that stores the current or power requirement of the respective subassembly, where the power requirement is needed during full-load operation of the subassemblies.

Figure 2:
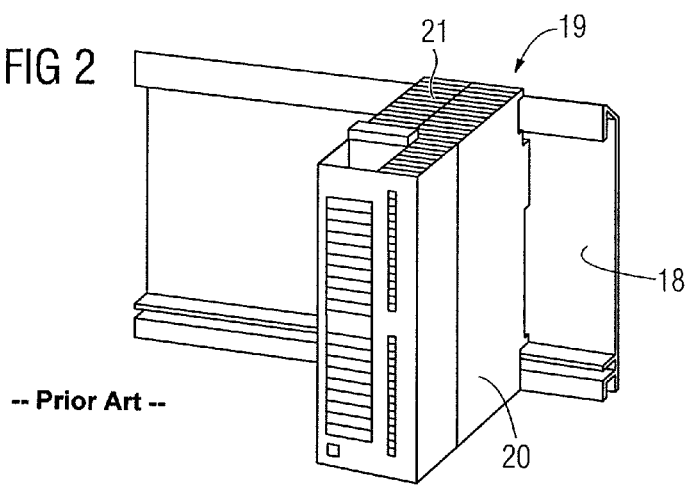
FIG. 2 is an illustration of a subassembly of an automation device, which subassembly is known per se.

Both power supplies 8, 9 and the other subassemblies 10, 11, 12, 13 include openings on the underside and the top side of a housing capsule to cool their components. In this respect, reference is made below to FIG. 2 which illustrates a conventional subassembly 19 that is arranged on a carrier 18. Cooling is effected substantially by convection such that air flows through openings on the underside of a housing capsule 20, flows across the electrical and electronic components of the subassembly and finally flows through an opening 21 on the top side of the housing capsule 20, where the air flowing through the housing removes heat from the components. On account of such a design of the subassembly 19, sufficient cooling during the control mode is possible only when the carrier 18 is arranged horizontally in a switchgear cabinet and the subassembly 19 is arranged vertically on the carrier 18.

Returning to FIG. 1, after the automation devices 2, 3 have been switched on or after the hardware configuration of the automation devices 2, 3 has been changed, during which a subassembly is added or a subassembly is replaced, the respective CPU subassemblies 10, 11 of the automation devices 2, 3 initially effect "position-dependent" power balancing that is performed by the CPU subassemblies 10, 11 before the actual control mode.

For this purpose, the CPU subassembly 10 reads the memories 14, 16 of all subassemblies 8, 10, 12 and checks, using the information stored in the memories 14, 16 with regard to the maximum power output of the power supply subassembly 8 and the power requirement of the respective subassemblies 8, 10, 12 and taking into account the installation position of the carrier 5 and the subassemblies 8, 10, 12, whether a permissible power output of the power supply subassembly 8 is sufficient to cover the total power requirement of these subassemblies 8, 10, 12. On account of the fact that a position sensor 22 of the CPU subassembly 10 transmits the installation position of the carrier 5 and the subassemblies

8, 10, 12 to the CPU subassembly 10 and the latter thereby recognizes that the carrier 5 has been installed horizontally and the subassemblies 8, 10, 12 have been mounted in a vertical installation position, the CPU subassembly 10 determines the maximum power output of the power supply subassembly 8 as a threshold value, i.e., a permissible power output. The CPU subassembly 10 compares this maximum power output with the total power requirement of the automation device 2, where the CPU subassembly 10 initiates power-restricting measures, i.e., measures for reducing the power requirement, for at least one of the subassemblies 12, if the total power requirement exceeds the maximum power output. For example, the CPU subassembly 10 switches off one of the subassemblies 12 or switches the latter or all subassemblies to a "STOP" operating state, where the control mode is not adopted in all cases.

If the maximum power output is not exceeded, which can usually be assumed based on the proper horizontal installation of the automation device 2 and the design measures of the subassemblies 8, 10, 12 with regard to heat dissipation (see FIG. 2), the CPU subassembly 10 of the automation device 2 changes into the control mode.

The CPU subassembly 11 effects "position-dependent" power balancing for the automation device 3 in the corresponding manner before the control mode is adopted. The CPU subassembly 11 reads the memories 15, 17 of all subassemblies 9, 11, 13 and, as described, checks whether the maximum power output of the power supply subassembly 9 suffices to cover the total power requirement of the subassemblies 9, 11, 13. In contrast to the automation device 2, the CPU subassembly 11 of the automation device 3 recognizes, based on a signal from a position sensor 23, that the carrier 6 has been installed vertically and the subassemblies 9, 11, 13 have been mounted in a horizontal installation position. This installation position and the structural design of the subassemblies 9, 11, 13 with regard to heat dissipation mean that the subassemblies 9, 11, 13 could overheat if the power supply subassembly 9 were to output its maximum power to cover the total power requirement of the subassemblies 9, 11, 13. The CPU subassembly 11 therefore predefines, as the threshold value, i.e., the permissible power output, 0.6 times the maximum power output of the power supply subassembly 9, where the threshold value is selected such that the subassemblies 9, 11, 13 in the horizontal installation position can be operated at an ambient temperature of 65° C. without the subassemblies 9, 11, 13 overheating.

If the total power requirement of the subassemblies 9, 11, 13 exceeds the permissible power output, the CPU subassembly 11 initiates, as described, power-restricting measures for at least one of the subassemblies 13. If the permissible power output is not exceeded, the CPU subassembly 11 of the automation device 3 changes into the control mode.

It should be understood that the position sensors 22, 23 do not need to be mounted on the carriers 5, 6 but rather may also be part of one of the subassemblies, preferably part of the CPU subassembly or power supply subassembly.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An automation device comprising:
a plurality of modules, at least one first module of the plurality of modules being configured to supply other modules of the plurality of modules with electrical power, and a second module of the plurality of modules being configured to determine a total power requirement of the automation device, the second module determining the total power requirement from information relating to the power requirement of a respective module of the plurality of modules, the information being stored in the other modules, and comparing the total power requirement with a threshold value and initiating measures for reducing the power requirement of at least one of the other modules based on a comparison result; and
a position sensor configured to detect a vertical or horizontal position of the automation device at an installation or erection site of the automation device after the automation device has been switched on, the second module one of predefining and determining the threshold value based on the vertical or horizontal position of the automation device after the automation device has been switched on.

2. The automation device as claimed in claim 1, wherein the second module one of predefines and determines a first threshold value in a first position of the automation device and one of predefines and determines a second threshold value smaller than the first threshold value in a second position of the automation device.

3. The automation device as claimed in claim 2, wherein the first threshold value corresponds to a maximum power of the first module of the plurality of modules.

4. The automation device as claimed in claim 3, wherein the second module indicates when one of the first threshold value and the second threshold value is one of reached and exceeded.

5. The automation device as claimed in claim 2, wherein the second module indicates when one of the first threshold value and the second threshold value is one of reached and exceeded.

6. The automation device as claimed in one of claim 1, further comprising a carrier, wherein said plurality of modules comprise respective subassemblies arranged on said carrier, the position sensor being arranged on the carrier or one of the subassemblies.

7. The automation device as claimed in claim 1, wherein said plurality of modules comprise respective subassemblies, the automation device further includes a plurality of mounting racks, each of said mounting racks including a carrier with subset of said subassemblies, each mounting rack including a respective said position sensor arranged on said each mounting rack or a subassembly of said each mounting rack.

* * * * *